(12) United States Patent
Ewing et al.

(10) Patent No.: US 6,442,017 B1
(45) Date of Patent: Aug. 27, 2002

(54) BATTERY-POWER DISTRIBUTION PANEL FOR NETWORK EQUIPMENT

(75) Inventors: Carrel W. Ewing, Palo Alto; Andrew J. Cleveland, San Martin, both of CA (US)

(73) Assignee: Server Technology, Inc., Reno, NV (US)

(*) Notice: Subject to any disclaimer, the term of this patent is extended or adjusted under 35 U.S.C. 154(b) by 0 days.

(21) Appl. No.: 09/635,537

(22) Filed: Aug. 9, 2000

(51) Int. Cl.[7] .................................................. H02B 1/26
(52) U.S. Cl. ........................ 361/628; 361/622; 361/626; 361/641; 174/38; 307/10.1
(58) Field of Search ................................ 361/622, 627, 361/331, 334, 341, 344, 346, 342, 355–356, 390–396, 399, 429, 601–602, 605, 623–626, 628, 641, 637, 643–645, 651; 174/68.1, 38, 52 R, 59; 200/51 R, 307; 307/9.1–10.8, 141–141.8, 11, 29, 38, 39, 85–87, 43, 52, 80; 439/76.1, 709, 564, 801, 722, 135, 92, 95, 108, 627, 500, 810, 814

(56) References Cited

U.S. PATENT DOCUMENTS 5,949,148 A * 9/1999 Wagner ..................... 307/10.1
6,067,023 A * 5/2000 Bendikas .................... 340/638
6,176,710 B1 * 1/2001 Ewing et al. .............. 439/76.1

* cited by examiner

Primary Examiner—Leo P. Picard
Assistant Examiner—Michael Datskovsky
(74) Attorney, Agent, or Firm—Richard B. Main

(57) ABSTRACT

A battery-power distribution unit comprises two printed circuit assembly bus units that carry eight pairs of ± screw terminal connections and their associated GMT-type fuses. Each A-side and B-side bus unit needs only one pair of heavy cables that feed it power inside a RETMA-rack cabinet. Heavy-duty foil buses etched on the printed circuit boards on both sides are reinforced with tinned copper flat bar to increase the current carrying capacity.

6 Claims, 5 Drawing Sheets

BATTERY-POWER DISTRIBUTION PANEL FOR NETWORK EQUIPMENT

BACKGROUND OF THE INVENTION

1. Field of the Invention

The invention relates generally to battery-power distribution equipment and more particularly to RETMA rack chassis units that provide individually fused circuit branches for independent computer-data-network appliances at telco sites.

2. Description of the Prior Art

There is a growing need for competitive local exchange carriers to manage remote power control functions of internetworking devices at telephone company (telco) central offices. Competitive local exchange carriers (CLECs), incumbent local exchange carriers (ILECs), independent telephone companies, and other next generation service providers are now all offering a digital subscriber line (DSL) service that promises high-speed Internet access for both homes and businesses. DSL is expected to replace integrated services digital network (ISDN) equipment and lines, and DSL competes very well with the T1 line that has historically been provided by ILECS. A DSL drop costs about $40–60 per month, and is expected to quickly become the dominant subscriber-line technology.

The DSL service is provided by a switch that is co-located in a telco central office, i.e., a digital subscriber line access multiplexer (DSLAM). Many new competitive local exchange carriers are now deploying DSL service in several states. They are installing digital subscriber line access multiplexers in many locations. Such digital subscriber line access multiplexers are now available from a number of different manufacturers, e.g., Paradyne, Copper Mountain, Ascend, etc.

Nearly all such digital subscriber line access multiplexers are powered by 48-VDC battery power and all have operator console ports. And for emergencies, these DSLAMs usually have two independent 48-VDC battery power supplies, e.g., an A-channel and a B-channel. Most commercial DSLAMs are also controlled by large operating systems that host various application software. Unfortunately, this means most DSLAMs have the potential to fail or lock-up, e.g., due to some software bug.

When a digital subscriber line access multiplexer does lock-up, the time-honored method of recovering is to cycle the power, i.e., reboot. But when a digital subscriber line access multiplexer is located at a telco central office, such location practically prevents it being easy to reboot manually.

There are many large router and ATM switch farms around the country that are equipped by the leading vendors, e.g., Cisco, Bay Networks/Nortel, Ascend, Lucent, Fore, etc. So each of these too has the potential to lock-up and need rebooting, and each of these is very inconvenient to staff or visit for a manual reboot when needed.

Server Technology, Inc., (Sunnyvale, Calif.) markets a 48-VDC remote power manager and intelligent power distribution unit that provides for remote rebooting of remote digital subscriber line access multiplexers and other network equipment in telco central offices and router farms. The SENTRY 48-VDC is a network management center that eliminates the dispatching of field service technicians to cycle power and rectify locked-up digital subscriber line access multiplexers.

Statistics show that seventy percent, or more, of all network equipment lock-ups can be overcome by rebooting, e.g., cycling power off and on. A remote power controller, like the SENTRY, can reduce network outages from hours to minutes.

In a typical installation, the telco central office provides the competitive local exchange carriers with bare rack space and a 48-VDC power feed cable that can supply 60–100 amps. The single power input is conventionally distributed through a fuse panel to several digital subscriber line access multiplexers in a RETMA-type equipment rack. Individual fuses in such fuse panel are used to protect each DSLAM from power faults.

But such fuses frequently weld themselves to their sockets in the fuse panel due to loose contacts and high amperage currents. It is ironic therefore that many digital subscriber line access multiplexers do not have power on/off switches. Thus it requires the fuse to be pried out and put back in so the DSLAM can be powered-off for rebooting. But when the fuse is welded, removing the fuse without damaging the fuse panel can be nearly impossible.

The Server Technology SENTRY 48-VDC accepts from the telco or other site host an A-power feed cable and a B-power feed cable. Internally, DC-power is distributed to a set of "A" and "B" rear apron output terminal blocks that are protected by push-to-reset circuit breakers. The fuse panel is no longer required. The A-feed and B-feed are then matched to the newer digital subscriber line access multiplexers that also require A-power supply and B-power supply inputs.

Sometimes digital signaling lines can lose the carrier. In such cases, the respective DSLAM must be rebooted to restore the DS3 line. A technician is conventionally required to visit the DSLAM, and use a console port to monitor how the software reboots, and if communications are correctly restored to the DS3.

A SENTRY 48-VDC can be used to remotely power-off the digital subscriber line access multiplexer in the event the carrier is lost. A companion asynchronous communications switch can be used to establish a connection to the DSLAM's console port. Power can be cycled to the DSLAM, and the asynchronous communications switch used to monitor the reboot operation to make certain that the carrier to the DS3 line is restored. The asynchronous communications switch is a low-cost alternative to the expensive terminal server typically used for console port access. The reboot process and the console port monitoring process can both be managed from an operations center, without the need to dispatch technical personnel to the remote location.

The floor space that a competitive local exchange carrier's equipment rack sits upon is very expensive, so the equipment stuffed in the vertical space in a rack ("U-space") must be as compact as possible. A typical rack may house several digital subscriber line access multiplexers, a terminal server, a fuse panel, and 48-VDC modems. A SENTRY 48-VDC uses "3U" (5.25 inches) of vertical RETMA-rack space, and combines the functions of a fuse panel, a terminal server, and a modem. As many as eight 20-amp devices, or four 35-amp devices can be supported.

Many host sites, and especially the telephone operating company offices, are very particular about the kind of equipment they allow on their premises. In general, equipment must meet the Network Equipment Building Standards (NEBS) established by Bellcore. For example, Bellcore has established the equipment specifications for fault-tolerance. NEBS was designed by Bellcore to manage and protect the large amount of intricate equipment located at telco central offices. NEBS specifications were designed to address every possible hazard that may occur at a telco central office, including fire, freeze and earthquake. NEBS certification requires products to be evaluated in extreme environments and phenomenon.

The importance and practice of collocating network servers at central offices has grown significantly in recent years with the growth of the ISP market and increasing opportunity for CLECs. NEBS certification is a necessity for equipment that is intended to be collocated within a telephone central office. A NEBS "Certificate of Compliance" can be obtained after product testing by MET Laboratories, and such certificate is recognized by all of the Regional Bell Operating Companies (RBOCs).

A consequence of NEBS is that equipment such as the SENTRY 48-VDC must have 48-VDC battery connectors that not only include positive and negative polarities, but ground too. Such connections must be made with double-hole battery compression lugs so that two nuts are used to fasten each cable. The ground connection must be made with a single cable which is at least one AWG size larger than the power feed cables to be able to carry the largest possible fault currents without open circuiting. The larger cable requires a larger compression lug size.

SUMMARY OF THE PRESENT INVENTION

It is therefore an object of the present invention to provide a battery-power distribution panel for network appliances at a telco central office.

It is another object of the present invention to provide a battery-power distribution unit that eliminates the bulk of the individual cable wiring needed internally to feed power to eight or more network appliance loads.

Briefly, a battery-power distribution unit embodiment of the present invention comprises two printed circuit assembly bus units that carry eight pairs of ± screw terminal connections and their associated GMT-type fuses. Each A-side and B-side bus unit needs only one pair of heavy cables that feed it power inside a RETMA-rack cabinet. Heavy-duty foil buses etched on the printed circuit boards on both sides are reinforced with tinned copper flat bar to increase the current carrying capacity.

An advantage of the present invention is that a battery-power distribution unit is provided that is simple to manufacture and robust in operation.

Another advantage of the present invention is that a battery-power distribution unit is provided for a DSLAM power manager that is NEBS compliant.

These and many other objects and advantages of the present invention will no doubt become obvious to those of ordinary skill in the art after having read the following detailed description of the preferred embodiments which are illustrated in the various drawing figures.

IN THE DRAWINGS

DETAILED DESCRIPTION OF THE PREFERRED EMBODIMENTS

Figure 1:
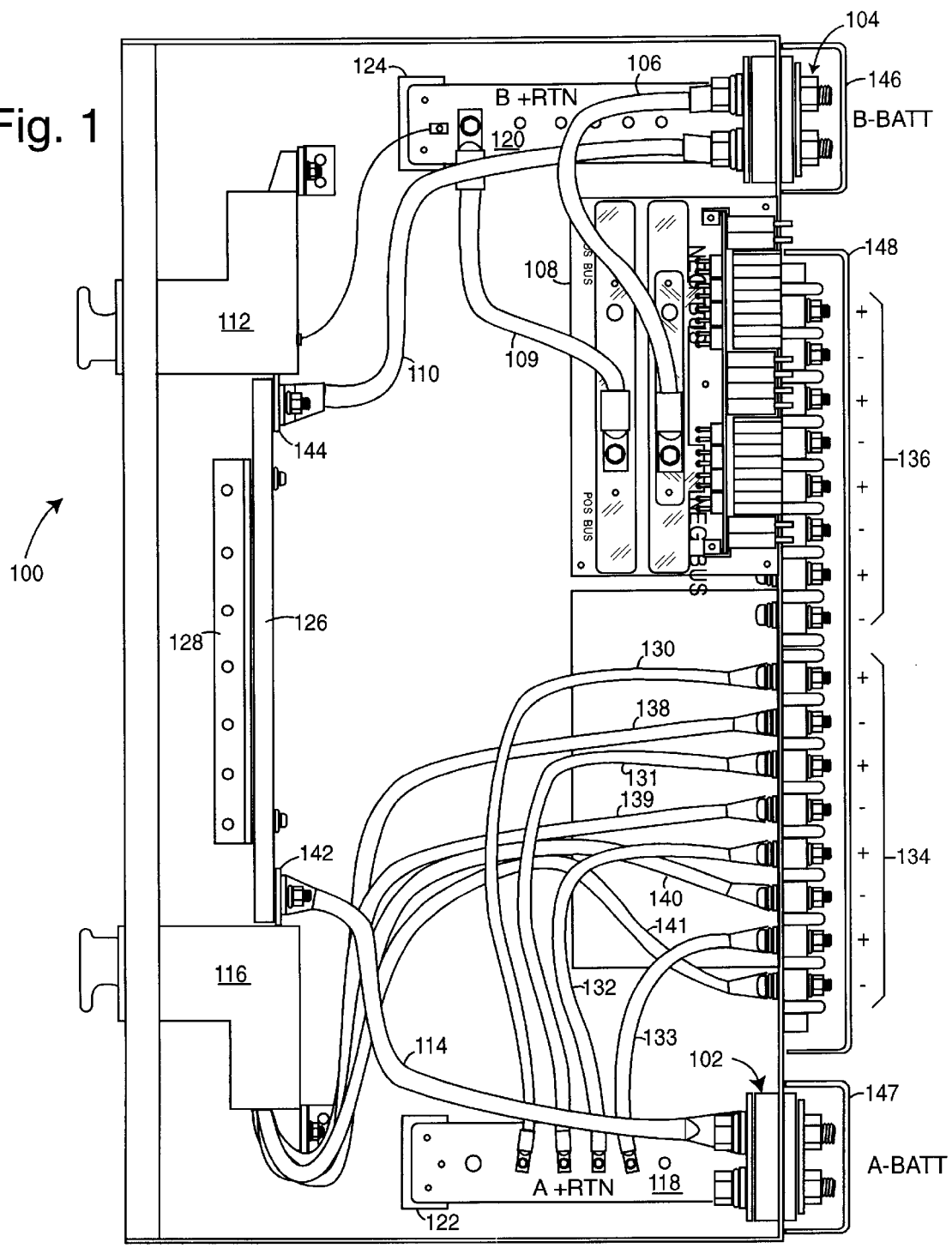
FIG. 1 is a plan view of a battery-power distribution panel embodiment of the present invention.

FIG. 1 illustrates a battery-power distribution panel embodiment of the present invention, referred to herein by the general reference numeral 100. The battery-power distribution panel 100 bolts into a standard RETMA-rack chassis. It distributes dual 48-volt buses to individual computer network equipment from external banks of batteries located at a telco central office. A typical battery-power distribution panel 100 is in a very mission-critical role, so redundant A and B battery power systems are used. So an A-battery connector 102 and a B-battery connector 104 are included, one on each rear corner.

The power connectors 102 and 104 include a plastic insulating block with a pair of separator walls, and is made of polycarbonate (LEXAN). A pair of bolts are provided for each of a battery return (+RTN) connection (bottom), a chassis ground (GND) connection (middle), and a battery supply (−48 VDC) connection (top). Telco central office battery power is wired from two separate batteries outside using heavy-gauge electrical cable and two-hole lug-nut terminals.

Inside the battery-power distribution panel 100, cables are bolted directly to the −48 VDC part on the power connectors 102 and 104. A cable 106 connects −48 VDC to a low-amperage B-side power-distribution printed circuit board (PCB) 108. A similar cable and PCB exist for the A-side, but are not shown in FIG. 1 to reduce the unnecessary clutter and to be able to show all the wiring more clearly. A B-side +RTN cable 109 connects between the bus 120 and the PCB 108. A second cable 110 connects B-side −48 VDC to a high-amperage four-part fuse cluster 112. A similar cable 114 for the A-side connects A-side −48 VDC to another high-amperage four-part fuse cluster 116. Both fuse clusters penetrate a front apron of the main chassis.

An A-side +RTN bus 118 bolts under the +RTN bolts of the A-battery power connector 102 and right-angles out parallel to the bottom floor. Such bus is preferably made of copper flat bar plated with tin or solder. Similarly, a B-side +RTN bus 120 bolts under the +RTN bolts of the B-battery power connector 104 and also right-angles out parallel to the bottom floor. Both buses 118 and 120 are respectively supported aloft at their distal ends by a pair of plastic blocks 122 and 124.

A fiberboard-panel strongback 126 is held perpendicular to the floor by a welded-on angle bracket 128. Such strongback 126 allows the fuse blocks 112 ands 116 to be mounted in a RETMA rack chassis. The preferred commercial units for fuse blocks 112 ands 116 are the so-called BUSSMAN "TPA" fuse types with LED indicators, and are intended by their manufacturer to be mounted differently than shown in FIG. 1. So this arrangement allows the peculiar benefits of these commercial units to be nevertheless enjoyed in a RETMA-rack installation.

The A-side in FIG. 1 illustrates the remaining cabling that is common to both halves. The A +RTS bus 118 connects to four cables 130–133. Each of these terminal in a high-amperage terminal strip 134. The B-side is represented by a terminal strip 136. The higher-current network appliances, e.g., fifty amps, are supplied on the back apron by terminal strips 134 and 136. Such higher-current network appliances are fused via fuse blocks 112 and 116. A set of cables 138–141 respectively wire to each of the four poles of fuse block 116. The supply sides of each of these four poles are bused together at a connector 142. The busing of these four poles in the B-side is represented by a connector 144.

A set of clear plastic covers 146–148 are used to protect the otherwise exposed battery connections. The clear plastic covers are made of clear polycarbonate to provide strength, and retained by screws into tops of separator walls.

Figure 2:
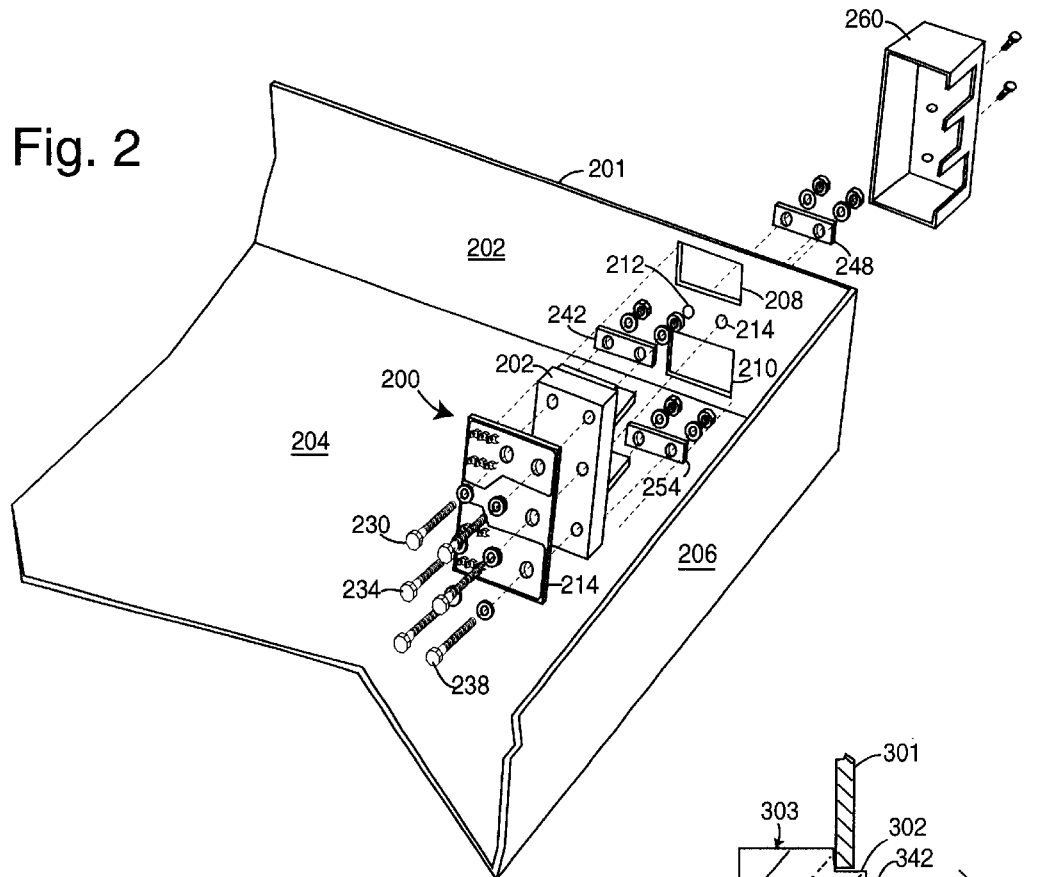
FIG. 2 is an exploded assembly view of a power connector in the left rear apron of the panel of FIG. 1.

FIG. 2 illustrates a typical power connector 200 mounted to a rear corner of a RETMA-rack chassis 201. Such has a rear panel 202, a bottom panel 204 and a side panel 206. Cutouts 208 and 210 allow the connectors' separator walls to pass completely through. A pair of bolt holes 212 and 214 are provided between the cutouts 208 and 210 that are used by bolts 234 and threaded backing plate 248 for mounting support and electrical connection (GND) to the chassis 201. In preferred embodiments of the present invention, the power connector 200 is constructed symmetrically such that a second, identical unit can be flipped over and mounted in the other corner of rear panel 202. The cover 260 is simply flipped over for the second unit. Identification labels are silk-screened on chassis 201.

In a prototype that was built of the power connector 200, the bolts that were used for bolts 230 and 238 were 1.75" long ¼-20, and made of stainless steel. Bolts 234 were 1.50" long, with ¼-20 threads, and also of stainless steel. The PCB 214 was one-sixteenth inch thick and 2.75" by 3.25". The block 202 had a base 1.875" by 3.25" by 0.375". The separator walls were 0.1875" thick and stood one inch above the base. A 0.25" thick pedestal under the stainless steel threaded backing plates 242 and 254 raises through cutouts 208 and 210.

Figure 3:
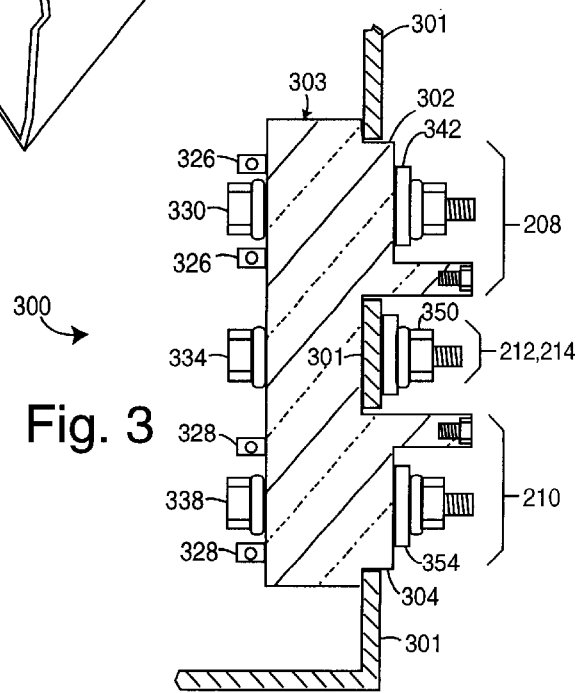
FIG. 3 is a cross-sectional view of the power connector of FIG. 2.

FIG. 3 illustrates, in cross-section, a similar power connector 300 mounted through the rear panel of a RETMA-rack chassis 301. A pedestal 302 in the plastic block 303 raises through the chassis cutout 208. This maintains an electrical isolation between the chassis panel 301 and the bolts 330, backing plate 342 and terminals 326. A pedestal 304 in the plastic block 303 raises through the chassis cutout 210. This maintains an electrical isolation between the chassis panel 301 and the bolts 338, backing plate 354 and terminals 328. A larger size connector and cable can be attached under nuts 350 to bolts 334 than are attached to either of the other two positions. For NEBS compliance, each power feed needs to support a ground wire, one AWG size larger than the power input wire. This assembly allows a larger compression lug to be connected for the ground.

Figure 4:
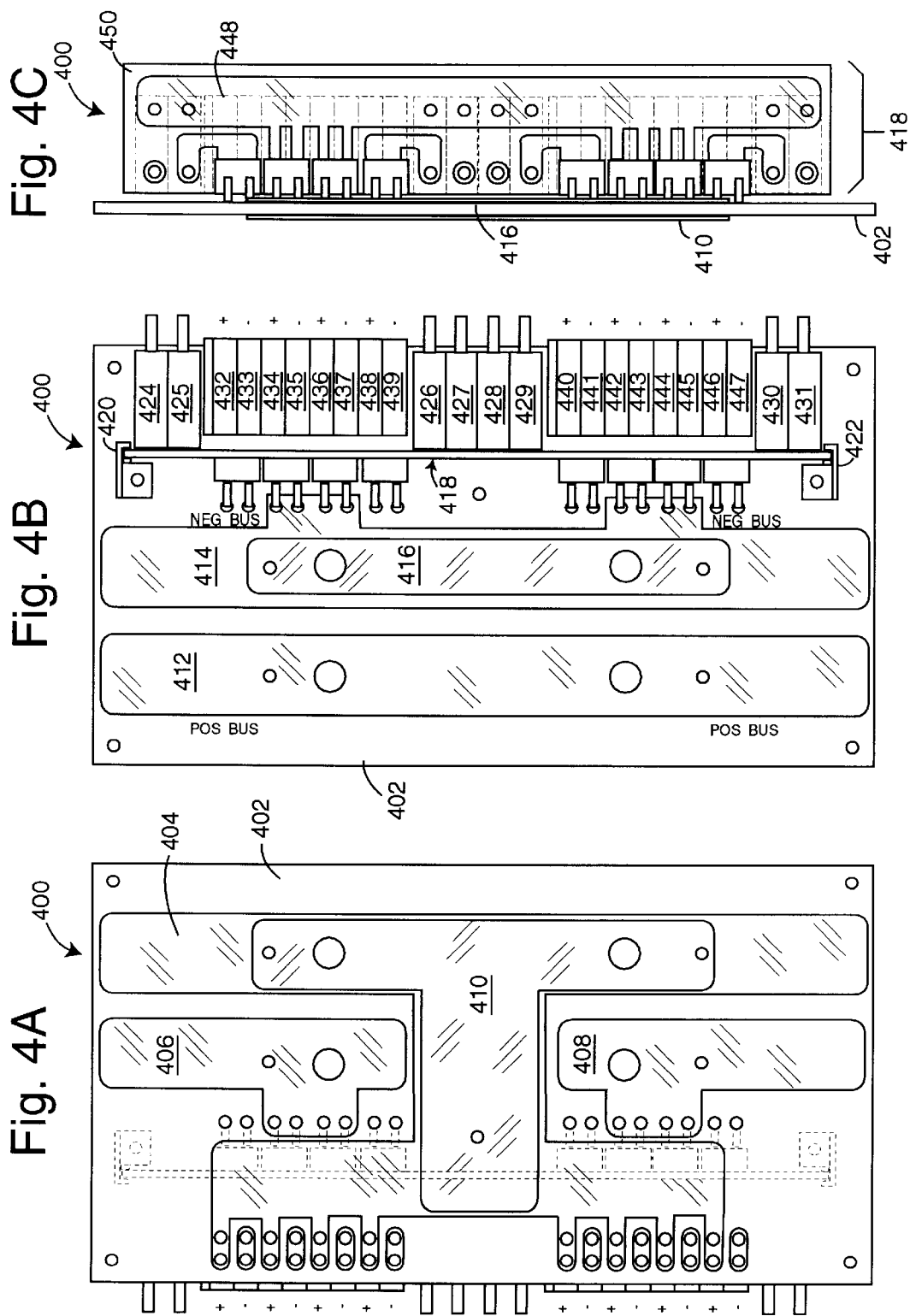
FIGS. 4A–4C are bottom, top, and end views of one of two low-amperage power-distribution printed circuit boards included in the panel of FIG. 1.

FIGS. 4A–4C show a PCB assembly 400 that is similar to the low-amperage B-side power-distribution printed circuit board 108. Two such PCB assemblies are used in battery-power distribution panel 100. Each PCB assembly 400 includes a fiberglass-epoxy substrate 402, a bottom positive-bus 404, a first bottom negative bus 406, a second bottom negative bus 408, and a bottom reinforcement bus 410. The buses 404, 406, and 408 are one or two ounce copper foil traces etched on the substrate 402. The reinforcement bus 410 comprises thin copper flat bar with tin or solder coating, and functions to increase the current-carrying capacity of the PCB assembly 400. Screws at each end hold it in tight contact with the underlying foil traces, and the bolts used to secure cables 106 and 109 hold the reinforcement buses 410 and 416 in even greater contact.

In FIG. 4B, the top side includes a top positive-bus 412, a top negative-bus 414, and a top reinforcement bus 416. A fuse and terminal assembly 418 is held perpendicular along one long edge by a pair of sheetmetal brackets 420 and 422.

A set of eight replaceable BUSSMAN GMT-type fuses 424–431 respectively supply −48 VDC power to a set of eight pairs of ± screw terminals 432–447.

In a typical application, each BUSSMAN GMT-type fuse 424–431 is rated at five amps, so a full PCB assembly 400 can carry forty amps.

As seen in FIG. 4C, the fuse and terminal assembly 418 includes a full-length negative-bus 448 on a fiberglass-epoxy substrate 450.

Figure 5:
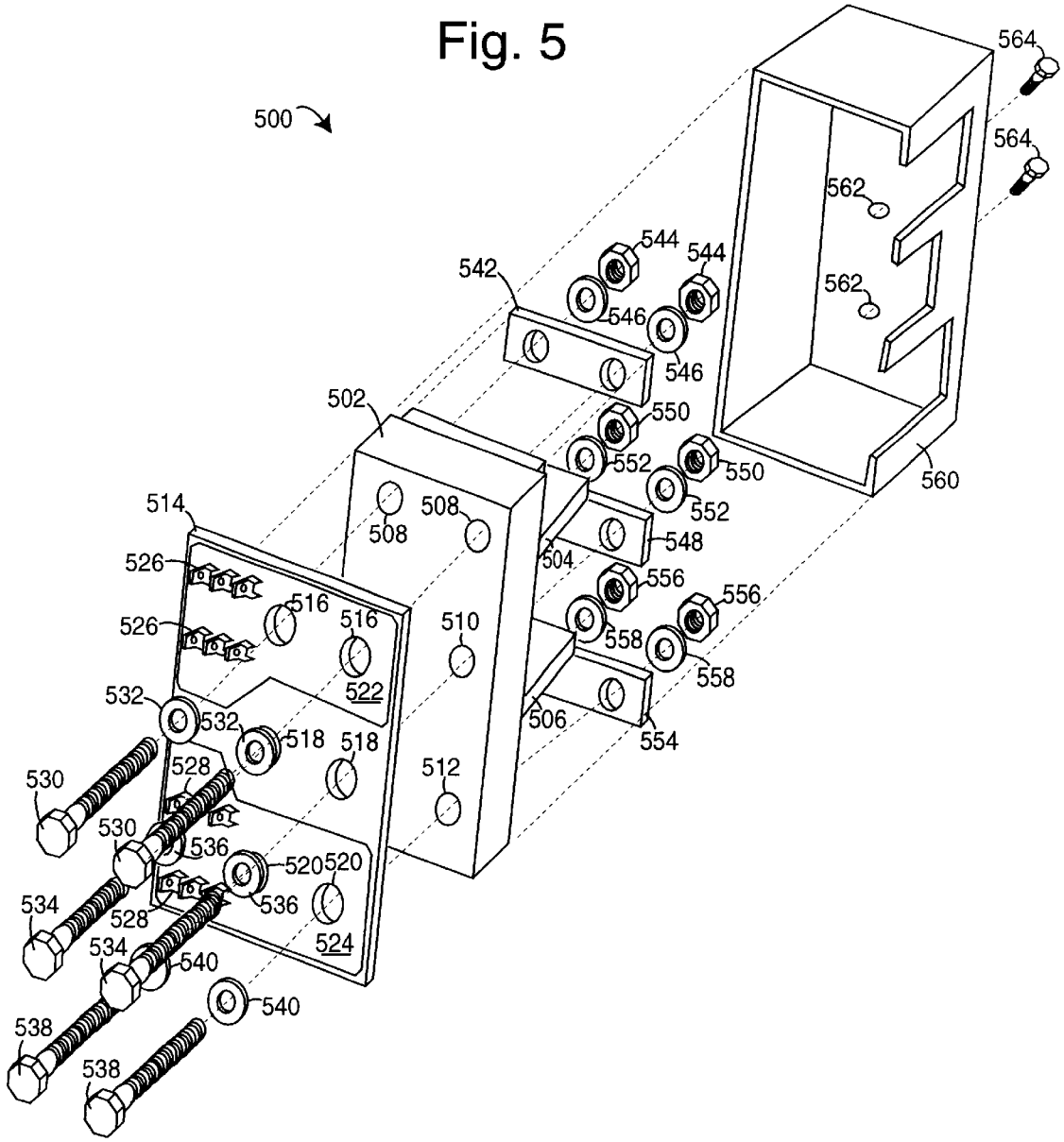
FIG. 5 is an exploded assembly view of a power connector embodiment of the present invention.

FIG. 5 illustrates a power connector embodiment of the present invention, referred to herein by the general reference numeral 500. The power connector 500 is intended to bolt to the rear panel of a standard RETMA-rack chassis. It provides dual 48-volt buses to the equipment within from external banks of batteries. A typical network power controller is in a very mission-critical role, so redundant power connectors 500 are preferred, e.g., one on each rear corner.

The power connector 500 includes a plastic insulating block 502 that has a pair of separator walls 504 and 506, and is typically made of polycarbonate (LEXAN). Such plastic insulating block 502 has a pair of bolt holes 508 for a battery return (+RTN) connection, a pair of bolt holes 510 (only one visible in FIG. 5) for a chassis ground (GND) connection, and another pair of bolt holes 512 (only one visible in FIG. 5) for a battery supply (−48 VDC) connection. A double-sided printed circuit board (PCB) 514 is provided with a pair of bolt holes 516 for the battery return (+RTN) connection, a pair of bolt holes 518 for chassis mounting, and another pair of bolt holes 520 for the battery supply (−48 VDC) connection.

The PCB 514 has a pair of copper foil patterns 522 and 524 that are etched on both sides of an epoxy-fiberglass substrate. The copper foil pattern 522 connects to several wire terminals 526 to distribute the battery-return potential inside a RETMA rack chassis. The copper foil pattern 524 connects to several wire terminals 528 to distribute the battery-supply potential inside such RETMA-rack chassis.

A pair of bolts 530 screw into holes 516 and 508 and use a pair of washers 532. These pass the battery return (+RTN) connection between the copper foil pattern 522 and the external batteries. A pair of bolts 534 pass through holes 518 and 510 and use a pair of washers 536. These are used to connect an external ground connection solidly to the RETMA-rack chassis. A pair of bolts 538 pass through holes 520 and 512 and use a pair of washers 540. These conduct the battery supply (−48 VDC) connection between the copper foil pattern 524 and the external batteries.

A threaded backing plate 542 for a two-hole compression lug connection for the battery return (+RTN) connection is retained by a pair of nuts 544 and locking washers 546. The threads in the backing plate allow the nuts to be removed for battery cable installation without also loosening the bolts 530. A second threaded backing plate 548 for a two-hole compression lug connection for the ground connection is retained by a pair of nuts 550 and locking washers 552. The threads in the backing plate allow the nuts to be removed for battery cable installation without also loosening the power connector 500 from the chassis it may be mounted to. A third threaded backing plate 554 for a two-hole compression lug connection for the battery supply (−48 VDC) connection is retained by a pair of nuts 556 and locking washers 558. The threads in the backing plate allow the nuts to be removed for battery cable installation without also loosening the bolts 538.

A clear plastic cover 560 is used to protect the otherwise exposed battery connections with heavy cables to the power connector 500. The clear plastic cover 560 is made of clear polycarbonate to provide strength and retained by a pair of screws 564 through holes 562 into threaded inserts 566 moulded into the tops of the separator walls 504 and 506.

Figure 6:
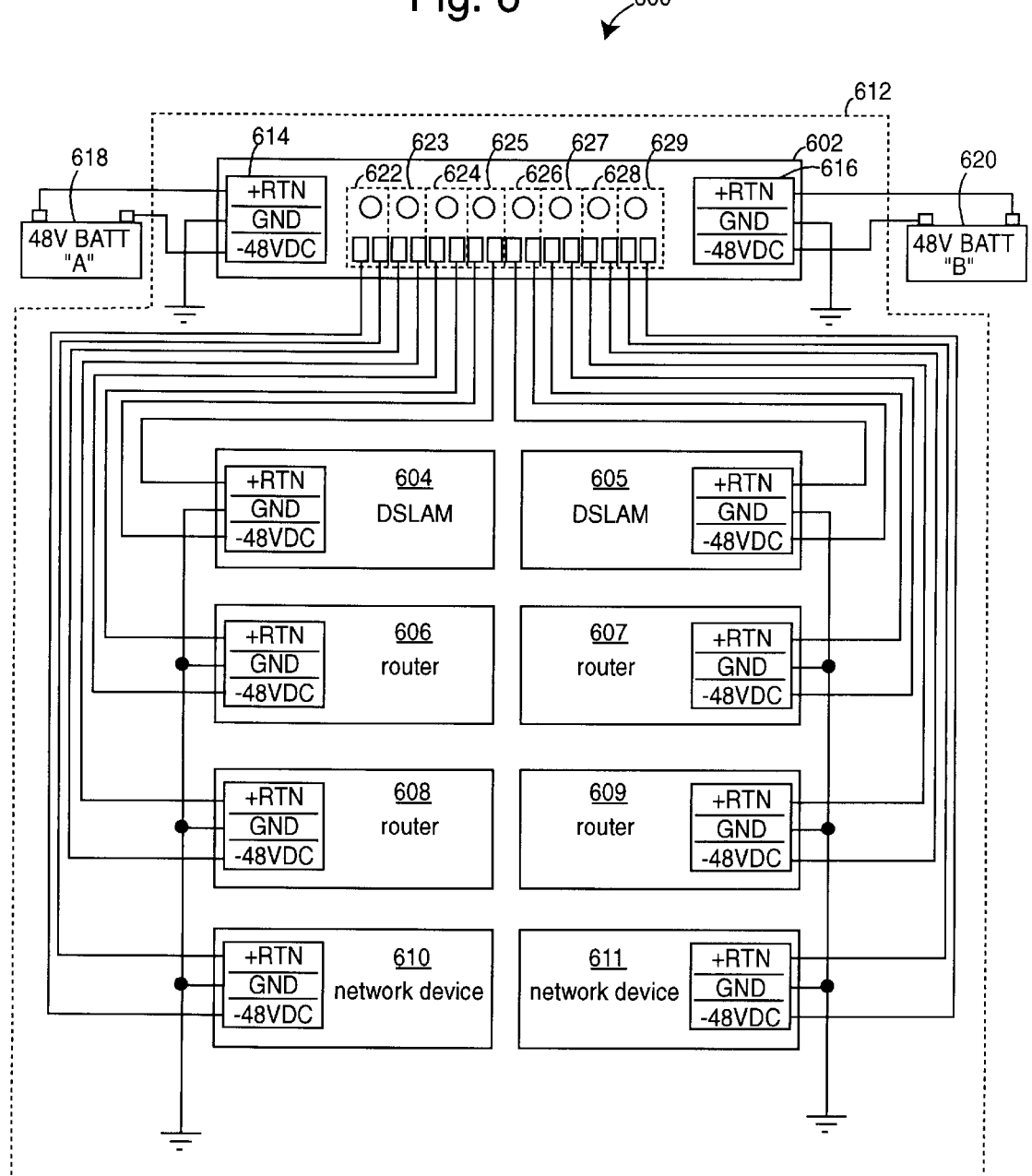
FIG. 6 is a schematic diagram of two batteries supplying power to several network appliances through a power distribution unit embodiment of the present invention.

FIG. 6 represents a system 600 that includes a dual 100-amp battery-power distribution unit (PDU) 602 providing A-side and B-side power to two DSLAMs 604 and 605, four routers 606, 607, 608 and 609, and two generic network devices 610 and 611.

The chassis are all mounted in a single RETMA-rack 612. An A-channel power connector 614 and a B-channel power connector 616 on the PDU 602 receive two circuits of 48-volt DC battery power from a telco central office site. A pair of batteries 618 and 620 represent these sources. A plurality of power distribution modules 622–629 internal to the PDU 602 are the equivalent of those shown in FIG. 1. Fused A-channel and B-channel DC-power is supplied to each DSLAM 604 and 605, routers 606, 607, 608 and 609, and generic network devices 610 and 611.

When any of the DSLAMs 604 and 605, routers 606, 607, 608 and 609, and generic network devices 610 and 611 need to be locally rebooted, a pair of corresponding fuses can be pulled briefly to cause both A-channel and B-channel DC power to cycle power off and on. The connected appliance will then be forced into a power-up reset and reboot.

Although the present invention has been described in terms of the present embodiment, it is to be understood that the disclosure is not to be interpreted as limiting. Various alterations and modifications will no doubt become apparent to those skilled in the art after having read the above disclosure. Accordingly, it is intended that the appended claims be interpreted as covering all alterations and modifications as fall within the true spirit and scope of the invention.

What is claimed is:

1. A power distribution unit, comprising:

a printed circuit board (PCB) for mounting inside a RETMA-rack cabinet;

a plurality of ± screw terminal pairs mounted on an edge of the PCB for providing a pair of DC-battery power connections to a network appliance colocated within a shared RETMA rack;

a plurality of fuses mounted on said edge of the PCB and connected to provide fuse-protection for a corresponding pair of connections in the plurality of ± screw terminal pairs;

a pair of etched-foil electrical distribution buses disposed on the surfaces of the PCB that interconnect all the plurality of ± screw terminal pairs and all the plurality of fuses; and a pair of bus reinforcements correspondingly disposed on the surfaces of the pair of etched-foil electrical distribution buses and for providing increased current carrying capacity.

2. The PDU of claim 1, further comprising:

a RETMA-rack cabinent that encloses the PCB;

a power connector located in a rear apron of the RETMA-rack cabinent; and a single pair of ± wire cables that interconnect the power connector and the pair of etched-foil electrical distribution buses.

3. The PDU of claim 2, wherein:

the power connector includes a double-bolt positive terminal, a double-bolt ground terminal, and a double-bolt negative terminal.

4. The PDU of claim 3, further comprising:

a bus bar connected to an inside part of said double-bolt positive terminal and supported at a distal end to the inside of the RETMA-rack cabinet with an insulating block.

5. The PDU of claim 4, wherein:

the single pair of ± wire cables are such that one connects inside to the bus bar for a +RTN circuit and another connects inside to said double-bolt negative terminal for a −48 VDC circuit.

6. The PDU of claim 5, further comprising:

a pair of fasteners that correspondingly clamp the pair of etched-foil electrical distribution buses and pair of bus reinforcements together with the single pair of ± wire cables.

* * * * *